United States Patent
Ghosh et al.

(10) Patent No.: US 9,263,349 B2
(45) Date of Patent: Feb. 16, 2016

(54) PRINTING MINIMUM WIDTH SEMICONDUCTOR FEATURES AT NON-MINIMUM PITCH AND RESULTING DEVICE

(71) Applicant: GLOBALFOUNDRIES inc., Grand Cayman (KY)

(72) Inventors: Sonia Ghosh, Fishkill, NY (US); Randy Mann, Milton, NY (US); Norman Chen, Poughkeepsie, NY (US); Shaowen Gao, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/074,981

(22) Filed: Nov. 8, 2013

(65) Prior Publication Data
US 2015/0130026 A1    May 14, 2015

(51) Int. Cl.
| G03C 5/00 | (2006.01) |
| H01L 21/66 | (2006.01) |
| G06F 17/50 | (2006.01) |
| H01L 21/3213 | (2006.01) |
| H01L 27/02 | (2006.01) |

(52) U.S. Cl.
CPC ............ *H01L 22/12* (2013.01); *G06F 17/5068* (2013.01); *H01L 21/32139* (2013.01); *H01L 27/0207* (2013.01)

(58) Field of Classification Search
CPC ..... H01L 21/308; H01L 23/481; H01L 27/12; H01L 21/8238; H01L 21/822

USPC .............. 438/8, 213, 199, 694; 257/351, 797; 430/30

See application file for complete search history.

(56) References Cited

U.S. PATENT DOCUMENTS

| 6,459,113 | B1 * | 10/2002 | Morihara et al. | 257/296 |
| 7,220,634 | B2 * | 5/2007 | Prall et al. | 438/216 |
| 7,585,742 | B2 * | 9/2009 | Koyama et al. | 438/401 |
| 8,058,137 | B1 * | 11/2011 | Or-Bach et al. | 438/401 |
| 8,415,089 | B1 * | 4/2013 | Gupta et al. | 430/311 |
| 8,575,760 | B2 * | 11/2013 | Phee et al. | 257/774 |
| 8,673,782 | B2 * | 3/2014 | Park et al. | 438/689 |
| 8,739,083 | B1 * | 5/2014 | Tung | 716/55 |
| 8,969,965 | B2 * | 3/2015 | Chang et al. | 257/347 |
| 9,009,641 | B2 * | 4/2015 | Becker et al. | 716/118 |
| 2002/0034855 | A1 * | 3/2002 | Horiguchi et al. | 438/298 |
| 2003/0198872 | A1 * | 10/2003 | Yamazoe et al. | 430/5 |
| 2004/0021139 | A1 * | 2/2004 | Jackson et al. | 257/40 |
| 2004/0043618 | A1 * | 3/2004 | Hellig et al. | 438/694 |
| 2007/0004117 | A1 * | 1/2007 | Yagishita | 438/197 |
| 2008/0036042 | A1 * | 2/2008 | Sano et al. | 257/620 |
| 2008/0128924 | A1 * | 6/2008 | Liu et al. | 257/797 |
| 2008/0160422 | A1 * | 7/2008 | Chen et al. | 430/5 |
| 2008/0179679 | A1 * | 7/2008 | Grudowski et al. | 257/351 |

(Continued)

*Primary Examiner* — Caleb Henry
(74) *Attorney, Agent, or Firm* — Ditthavong & Steiner, P.C.

(57) ABSTRACT

Methods for forming a semiconductor layer, such as a metal1 layer, having minimum width features separated by a distance greater than a minimum pitch, and the resulting devices are disclosed. Embodiments may include determining a first shape and a second shape having a minimum width within a semiconductor layer, wherein a distance between the first shape and the second shape is greater than a minimum pitch, determining an intervening shape between the first shape and the second shape, and designating a dummy shape within the intervening shape, wherein the dummy shape is at the minimum pitch from the first shape.

11 Claims, 7 Drawing Sheets

(56) References Cited

U.S. PATENT DOCUMENTS

| | | | |
|---|---|---|---|
| 2009/0130852 A1* | 5/2009 | Kewley | 438/694 |
| 2009/0273100 A1* | 11/2009 | Aton et al. | 257/786 |
| 2011/0057315 A1* | 3/2011 | Fang et al. | 257/750 |
| 2011/0102011 A1* | 5/2011 | Van der Plas et al. | 324/762.03 |
| 2011/0113393 A1* | 5/2011 | Sezginer | 716/106 |
| 2011/0215479 A1* | 9/2011 | Schulz et al. | 257/773 |
| 2011/0241207 A1* | 10/2011 | Kuo et al. | 257/741 |
| 2011/0281220 A1* | 11/2011 | Matsuda | 430/325 |
| 2012/0018807 A1* | 1/2012 | Tsuchiya et al. | 257/347 |
| 2012/0032273 A1* | 2/2012 | Suzuki | 257/369 |
| 2012/0094492 A1* | 4/2012 | Park et al. | 438/694 |
| 2012/0273955 A1* | 11/2012 | Or-Bach et al. | 257/762 |
| 2012/0299106 A1* | 11/2012 | Mann | 257/351 |
| 2012/0313256 A1* | 12/2012 | Lu et al. | 257/774 |
| 2013/0020707 A1* | 1/2013 | Or-Bach et al. | 257/741 |
| 2013/0122672 A1* | 5/2013 | Or-Bach et al. | 438/199 |
| 2013/0236836 A1* | 9/2013 | Sun et al. | 430/322 |
| 2013/0242645 A1* | 9/2013 | Calhoun et al. | 365/154 |
| 2014/0003133 A1* | 1/2014 | Lin et al. | 365/154 |
| 2014/0162460 A1* | 6/2014 | Lee et al. | 438/703 |
| 2014/0235055 A1* | 8/2014 | Mehta et al. | 438/694 |
| 2014/0264961 A1* | 9/2014 | Huang | 257/797 |
| 2014/0282344 A1* | 9/2014 | Hsu et al. | 716/123 |
| 2015/0064916 A1* | 3/2015 | Shieh et al. | 438/702 |
| 2015/0084129 A1* | 3/2015 | Lee et al. | 257/347 |

* cited by examiner

PRINTING MINIMUM WIDTH SEMICONDUCTOR FEATURES AT NON-MINIMUM PITCH AND RESULTING DEVICE

TECHNICAL FIELD

The present disclosure relates to printing minimum width features. The present disclosure is particularly applicable to printing minimum width features at non-minimum width pitch and is particularly applicable to 20 nanometer (nm) technology nodes and beyond.

BACKGROUND

Semiconductor layers may undergo a process of retargeting to ensure printability and manufacturability, particularly for 20 nm nodes and smaller. Retargeting involves the process of taking design shapes provided by semiconductor designers and turning the shapes into target shapes after tape-out. As a result of retargeting, it is not possible to attain minimum metal width for non-minimum pitch metals. The inability to obtain minimum metal width for non-minimum metal pitch metals poses particular problems. Certain semiconductor designs may require narrower widths or more spacing than what retargeting allows, to satisfy design constraints.

A need therefore exists for the ability to print minimum width semiconductor design features at non-minimum pitch, and resulting devices.

SUMMARY

An aspect of the present disclosure is a method of forming a semiconductor layer having minimum width features separated by a distance greater than a minimum pitch.

Another aspect of the present disclosure is a semiconductor device having a layer with minimum width features separated by a distance greater than a minimum pitch.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including determining a first shape and a second shape having a minimum width within a semiconductor layer, where a distance between the first shape and the second shape is greater than a minimum pitch, determining an intervening shape between the first shape and the second shape, and designating a dummy shape within the intervening shape, where the dummy shape is at the minimum pitch from the first shape.

An aspect of the present disclosure includes designating a second dummy shape within the intervening shape, where the second dummy shape is at the minimum pitch from the second shape. Another aspect includes the dummy shape being at the minimum pitch from the second shape. Yet another aspect includes the dummy shape having the minimum width. A further aspect includes patterning a first hardmask according to the first shape, the second shape and the dummy shape during a first lithography-etch step in forming the semiconductor layer. Still another aspect includes patterning a second hardmask according to the intervening shape during a second lithography-etch step in forming the semiconductor layer. A further aspect includes at least part of the patterned first hardmask and the patterned second hardmask overlapping according to the dummy shape. An additional aspect includes the semiconductor layer being a metal1 (M1) layer.

Another aspect of the present disclosure is a device including: a semiconductor layer including: a first shape and a second shape having a minimum width, where a distance between the first shape and the second shape is greater than a minimum pitch, and an intervening shape between the first shape and the second shape.

Aspects include the semiconductor layer being an M1 layer. Further aspects include a portion of the intervening shape including a dummy shape, where the dummy shape is at the minimum pitch from the first shape. Another aspect includes the dummy shape having the minimum width. Further aspects include a second portion of the intervening shape including a second dummy shape, where the second dummy shape is at the minimum pitch from the second shape. Yet another aspect includes the semiconductor layer formed by patterning a first hardmask according to the first shape, the second shape and the dummy shape during a first lithography-etch step. Still another aspect includes the semiconductor layer formed by patterning a second hardmask according to the intervening shape during a second lithography-etch step. Another aspect includes at least part of the patterned first hardmask and the patterned second hardmask overlapping according to the dummy shape in forming the semiconductor layer.

Another aspect of the present disclosure is a method including determining a first shape having a minimum width that is greater than a minimum pitch from a second shape having the minimum width, and designating a dummy shape in an intervening shape between the first shape and the second shape, where the dummy shape is at the minimum pitch from the first shape and the second shape and is at least the minimum width.

Additional aspects include the dummy shape including a first portion and a second portion, the first portion being at the minimum pitch from the first shape and the second portion being at the minimum pitch from the second shape. Yet another aspect includes the first portion and the second portion each having the minimum width. Further aspects include patterning a first hardmask according to the first shape, the second shape and the dummy shape during a first lithography-etch step in forming the semiconductor layer, and patterning a second hardmask according to the intervening shape during a second lithography-etch step in forming the semiconductor layer, where at least part of the patterned first hardmask and the patterned second hardmask overlap according to the dummy shape Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current inability to form minimum width features separated by distances greater than a minimum pitch attendant upon retargeting, particularly associated with litho-etch, litho-etch (LELE) processing for forming metal layers in semiconductor devices of 20 nm technology nodes and beyond. In accordance with embodiments of the present disclosure, dummy shapes at a minimum pitch from the minimum width features are designated in intervening shapes between the minimum width features.

Methodology in accordance with an embodiment of the present disclosure includes determining a first shape and a second shape having a minimum width within a semiconductor layer, such as a M1 layer, with the distance between the first shape and the second shape being greater than a minimum pitch. Next, an intervening shape is determined between the first shape and the second shape. At least one dummy shape is designated within the intervening shape with the at least one dummy shape being a minimum pitch from one or more of the first shape and the second shape. During patterning and formation of the minimum width features, the dummy shape is also patterned and formed, such as during the same litho-etch step in a LELE process, thereby avoiding the requirement of retargeting while achieving design constraints requiring minimum width features separated by greater than a minimum pitch.

Figure 1:
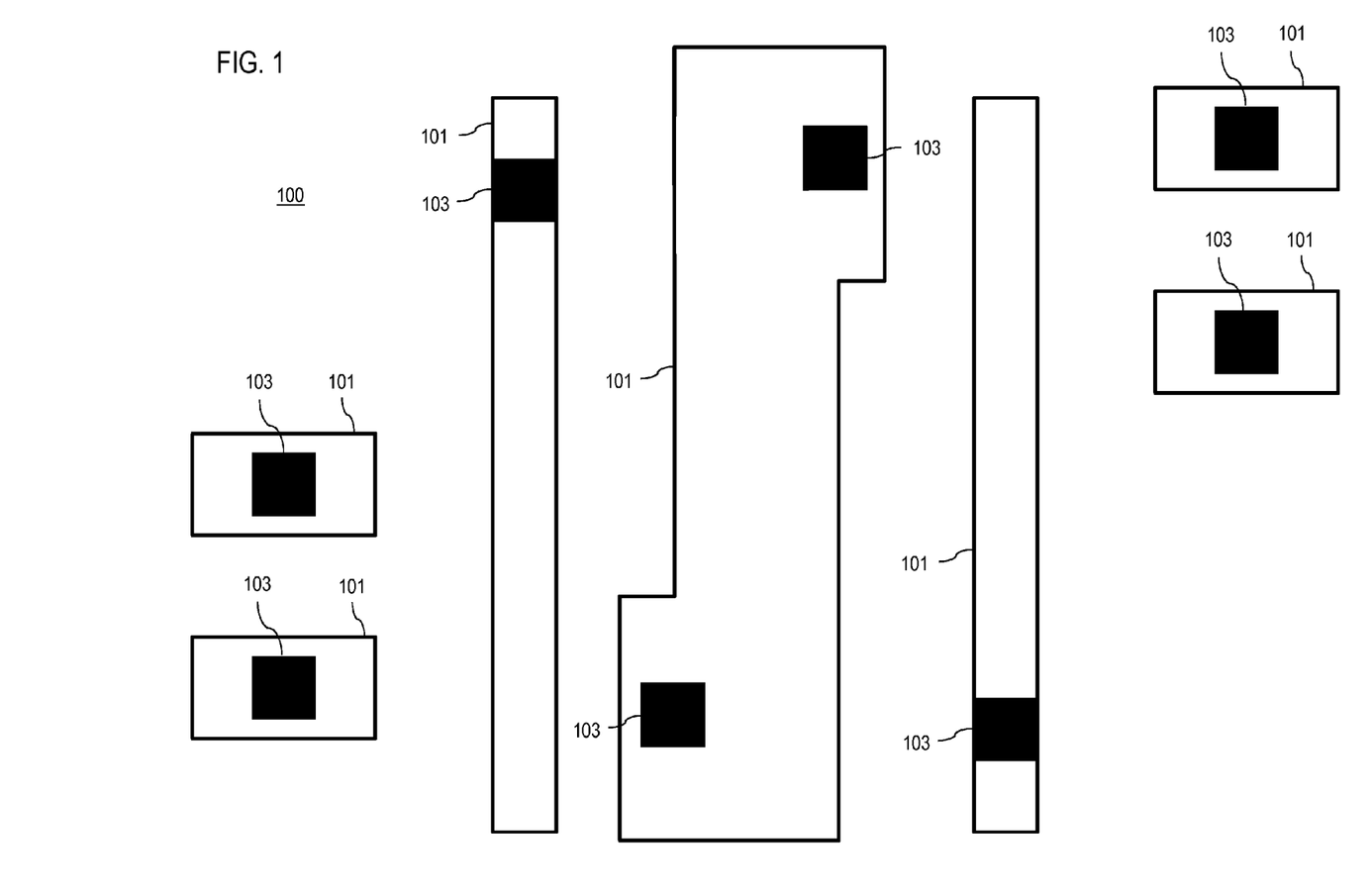
FIGS. 1 and 2 are schematic diagrams of a layout of a semiconductor layer, in accordance with an exemplary embodiment.
Figure 2:
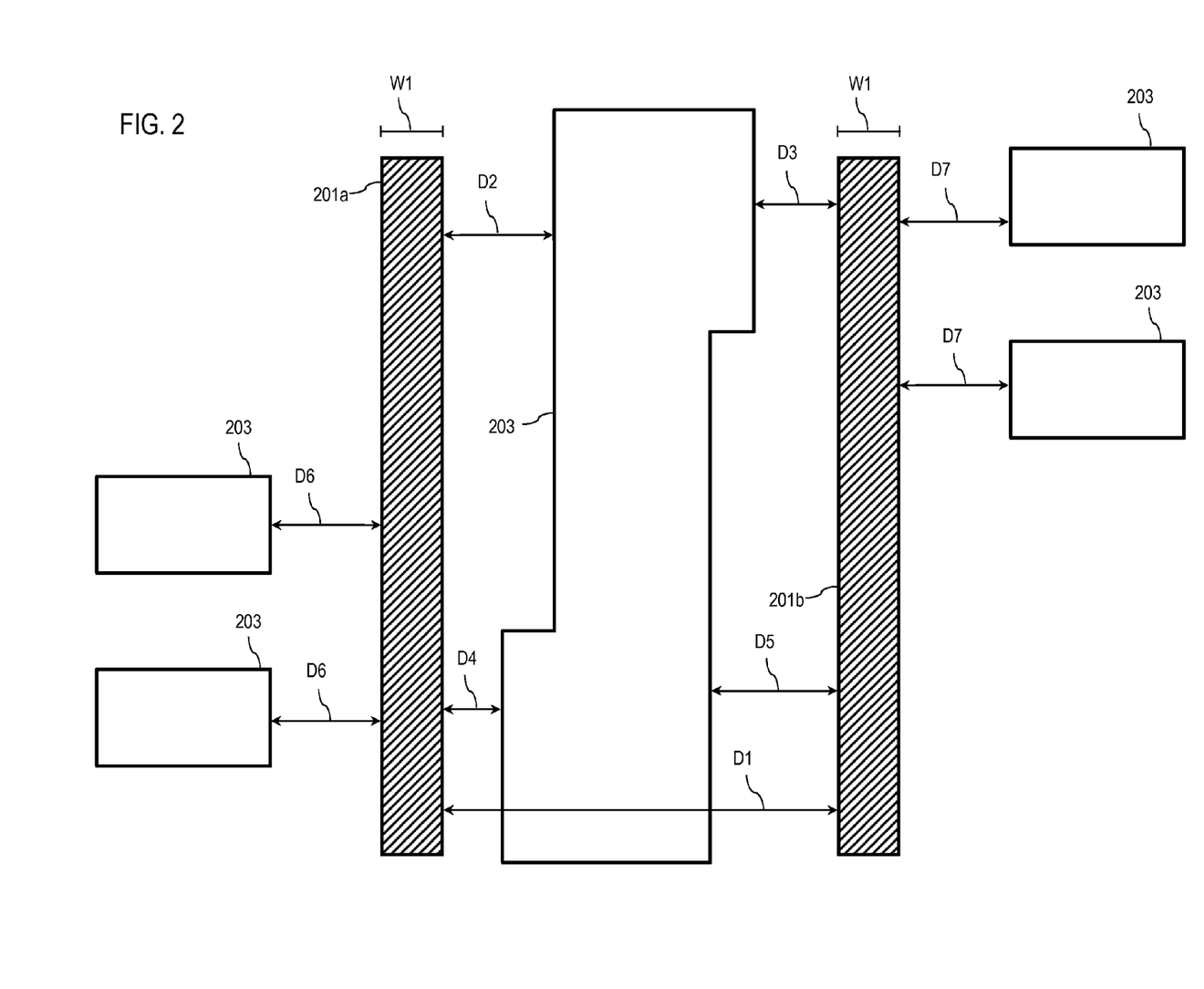

Adverting to FIG. 1, a bitcell layout 100 for a semiconductor design, such as for a static-random access memory (SRAM) cell, may include a metal layer 101 (e.g., M1 layer) and a vertical interconnect access (VIA) layer 103 (e.g., V0 layer). Although described as a single metal layer 101, because of limits in semiconductor manufacturing, the metal layer 101 may be formed using multiple lithography-etch steps, such as LELE. Thus, FIG. 2 illustrates the metal layer 101 divided into two litho-etch steps. A first litho-etch step may include forming shapes 201*a* and 201*b* and a second litho-etch step may include forming shapes 203. Although described as first and second litho-etch steps, the order of the steps may be switched. Shapes 201*a* and 201*b* may correspond to bitlines and may have minimum width W1, such as 32 nm. Although illustrated as line segments, shapes 201*a* and 201*b* may continue above and below the illustration in FIG. 2 as continuous bitlines. Shape 203 may correspond to various contacts for the VIAs in the VIA layer 103. Shapes 201*a*, 201*b*, and 203 may be separated by distances D2 through D7, as illustrated. However, shape 201*a* may be separated a distance D1 from feature 201*b*. The distance D1 may be greater than a minimum pitch, such as the distance D1 being 256 nm and the minimum pitch being 128 nm for a shape with a minimum width of 32 nm. Although described as a M1 layer, the metal layer 101 may be any layer, such as any metal layer (e.g., M1-$M_n$) or other non-metal layer that may include shapes of a minimum width that are separated by a distance greater than a minimum pitch.

Figure 3:
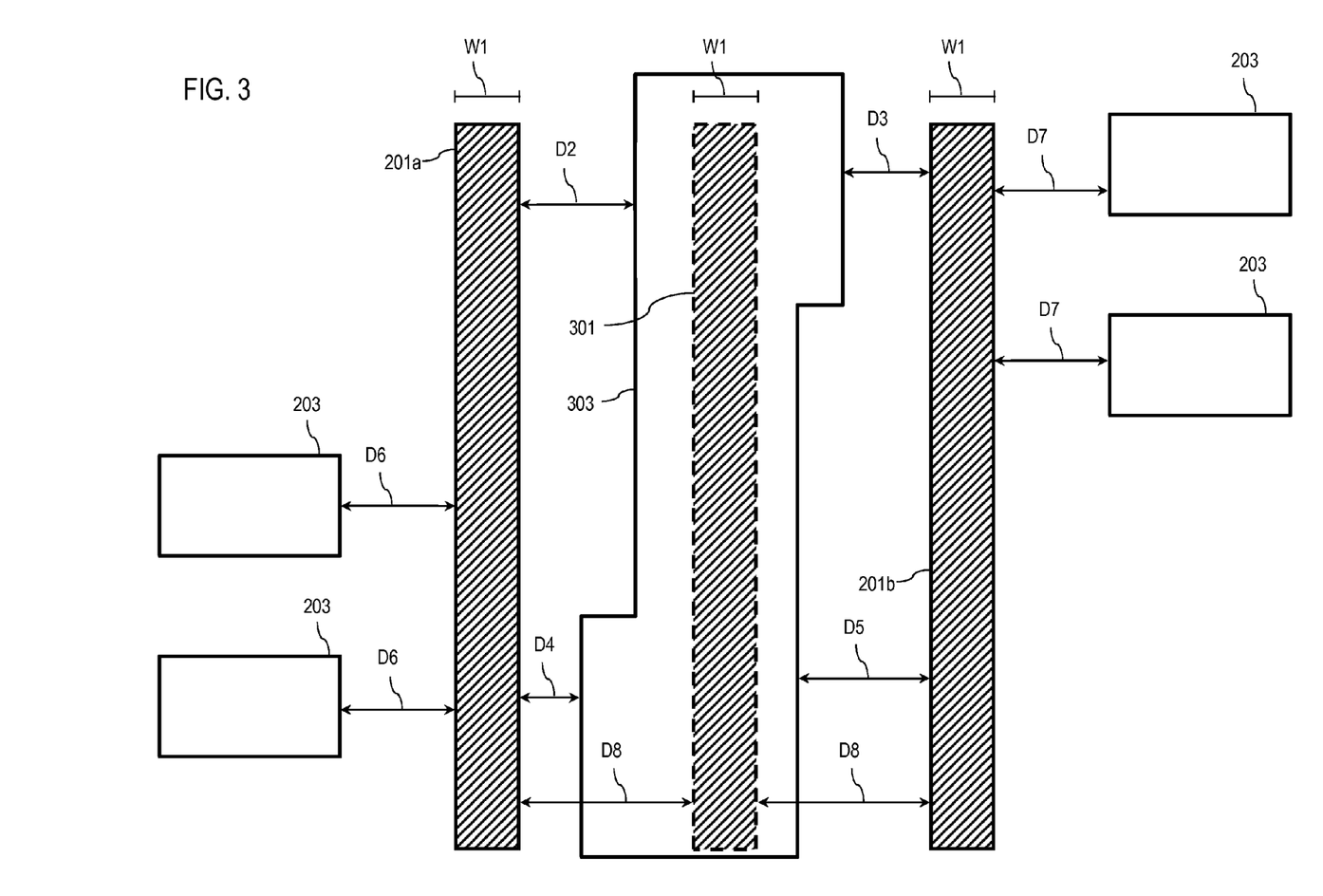
FIGS. 3 through 5 are schematic diagrams of layouts of a semiconductor layer including one or more dummy shapes in an intervening shape, in accordance with exemplary embodiments.

Shape 203 may include intervening shape 303 that is between shapes 201*a* and 201*b*, as illustrated in FIG. 3. Based on the presence of intervening shape 303 between shapes 201*a* and 201*b*, a dummy shape 301 may be designated within the intervening shape 303. The dummy shape 301 may be associated with the litho-etch step associated with shapes 201*a* and 201*b*, as indicated by the similar fill pattern in FIG. 3. As illustrated, the dummy shape 301 may be fully contained within the intervening shape 303. Further, the dummy shape 301 may be a distance D8 from shapes 201*a* and 201*b*. The distance D8 may be the minimum pitch such that shapes 201*a* and 201*b* are a minimum pitch from the dummy shape 301. Further, the dummy shape 301 may have the minimum width W1 as shapes 201*a* and 201*b* (e.g., 32 nm), or may have a width narrower than the minimum width W1. Thus, during patterning and formation of shapes 201*a* and 201*b* for the metal layer 101 (e.g., M1 layer) in a litho-etch step, the dummy shape 301 may be patterned and formed along with shapes 201*a* and 201*b*. Because the intervening shape 303 is formed during a subsequent (or previous) litho-etch step in forming the metal layer 101 that fully contains the dummy shape 301, the presence of the dummy shape 301 does not affect formation of the ultimate bitcell layer. Rather, patterning and etch for dummy shape 301 will merely partially correspond to the patterning and etch for the intervening shape 303. Designating dummy shape 301 within the intervening shape 303 allows for forming shapes 201*a* and 201*b* having minimum widths but still separated by greater than a minimum pitch from each other and alleviates any need for retargeting.

FIG. 3 illustrates an example where the minimum width of shapes 201*a* and 201*b* combined with the minimum pitch D8 and distance D1 allows for one dummy shape 301 of the minimum width fully contained within the intervening shape 303 and at the minimum pitch from both shapes 201*a* and 201*b*. However, depending on specific values for the minimum width, minimum pitch and distance between minimum width shapes, more than one dummy shape having a minimum width may be formed within the intervening shape 303.

Figure 4:
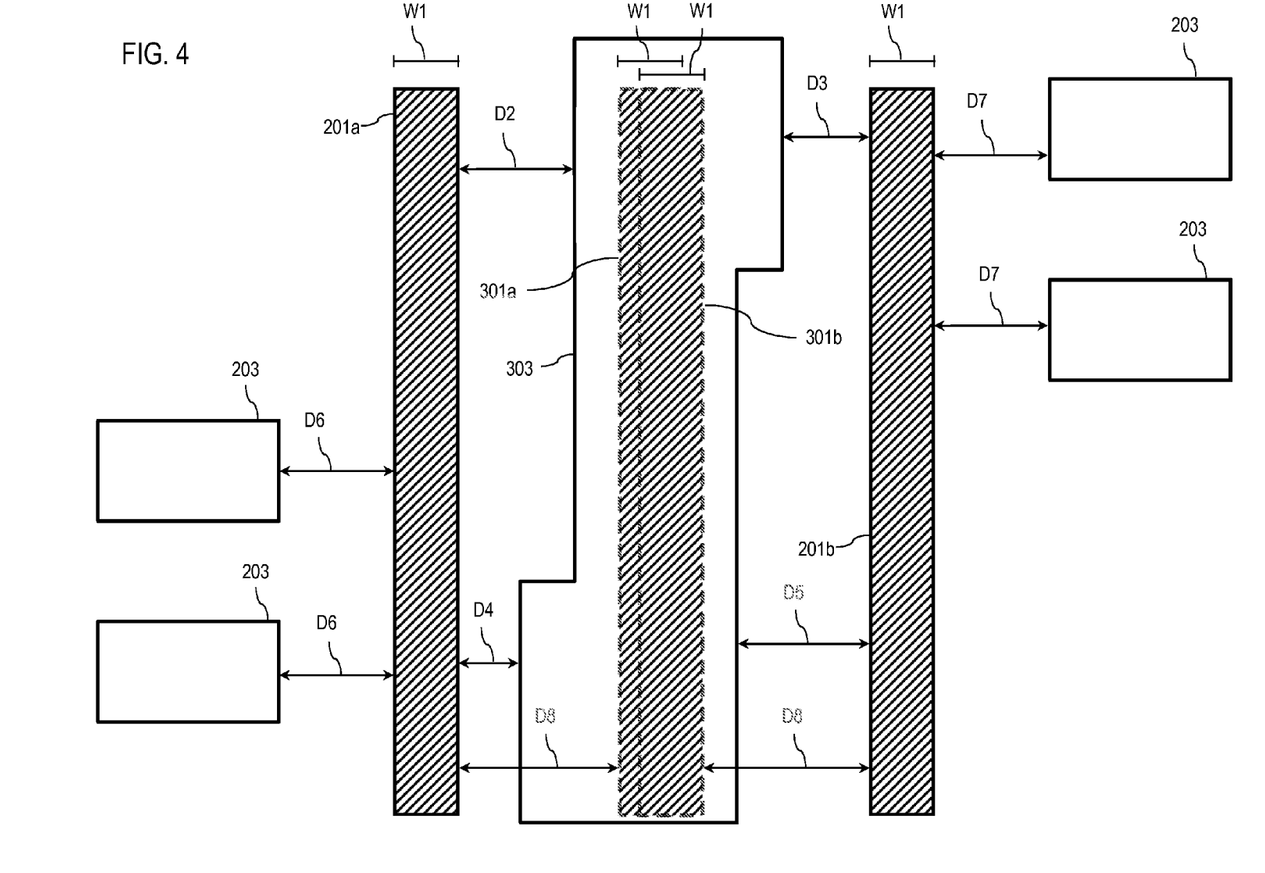

FIG. 4 illustrates two dummy shapes 301*a* and 301*b* within intervening shape 303. Both dummy shapes 301*a* and 301*b* may be formed having the minimum width W1, with dummy shape 301*a* at a minimum pitch D8 from shape 201*a* and dummy shape 301*b* at a minimum pitch D8 from shape 201*b*. Thus, dummy shape 301 may be composed of multiple dummy shapes (e.g., 301*a* and 301*b*) or portions with each portion having a minimum width (e.g., W1) and being a minimum pitch (e.g., D8) from a non-dummy shape having a minimum width (e.g., shapes 201*a* and 201*b*). Further, dummy shapes 301*a* and 301*b* may be formed during the same litho-etch step as shapes 201a and 201b, as indicated by the similar fill pattern illustrated in FIG. 4.

Figure 5:
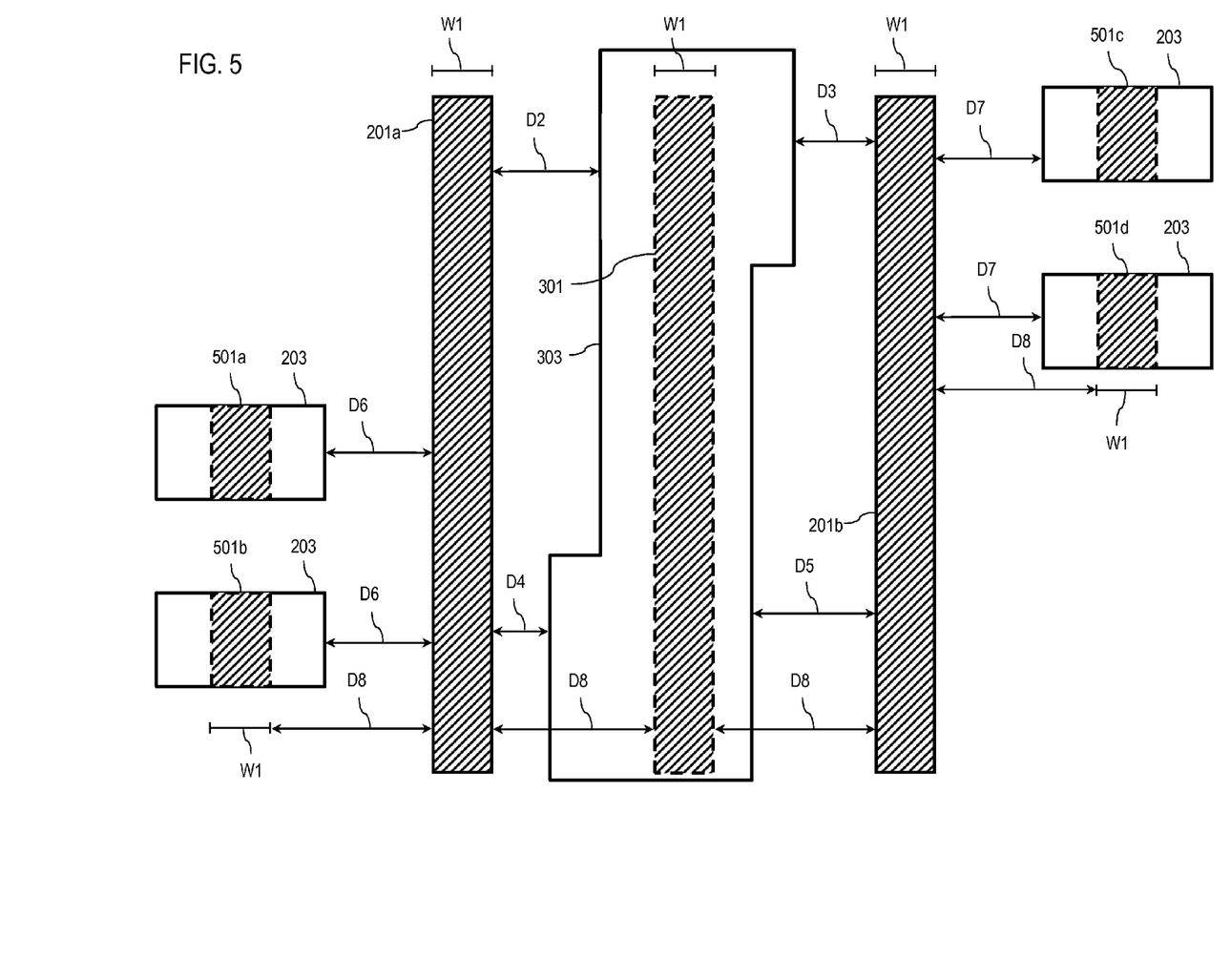

Although illustrated between shapes 201a and 201b, dummy shapes may also be designated in other portions of shape 203 that are not between shapes 201a and 201b, in addition to being designated in intervening shape 303. FIG. 5 illustrates that dummy shapes 501a and 501b may be designated within shape 203 to the left of shape 201a and dummy shapes 501c and 501d may be designated within shape 203 to the right of shape 201b. Dummy shapes 501a through 501d may correspond to virtual bitlines that intervene with the portions of shape 203 on either side of shapes 201a and 201b. As further illustrated, dummy shapes 501a through 501d have the minimum width W1. Further, dummy shapes 501a and 501b are separated from shape 201a by the minimum pitch D8, and dummy shapes 501c and 501d are separated from shape 201b by the minimum pitch D8. Further, dummy shapes 501a through 501d may be formed during the same litho-etch step as shapes 201a and 201b, as indicated by the similar fill pattern illustrated in FIG. 5.

Figure 6:
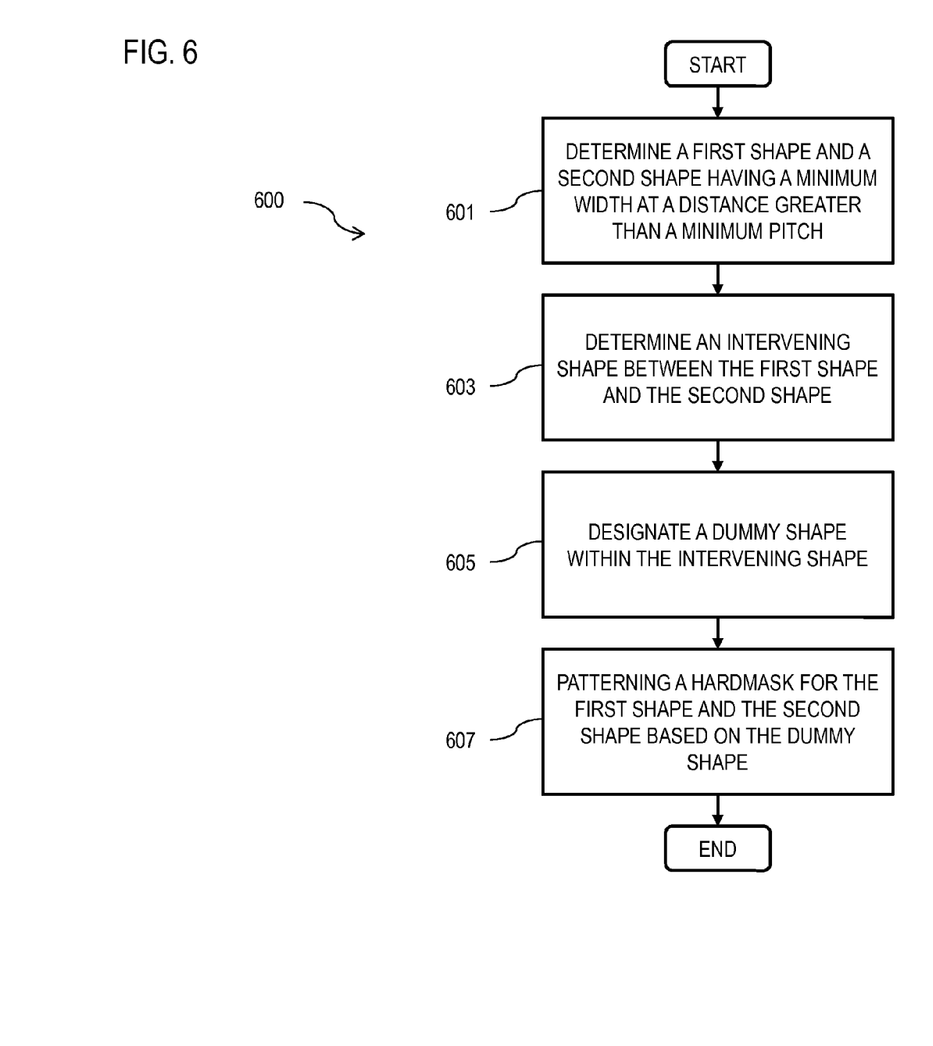
FIG. 6 is a flowchart of a process for forming a semiconductor layer using one or more dummy shapes in an intervening shape, in accordance with an exemplary embodiment.

FIG. 6 is a flowchart of a process 600 forming a semiconductor layer using one or more dummy shapes in an intervening shape, according to an exemplary embodiment. At step 601, a first shape and a second shape are determined that have a minimum width within a semiconductor layer, where a distance between the first shape and the second shape is greater than a minimum pitch. As discussed above, a first shape and a second shape may have a width of 32 nm, which may be a minimum width, and the first shape may be separated from the second shape by more than a minimum pitch, such as 128 nm.

At step 603, an intervening shape is determined between the first shape and the second shape. The intervening shape may be less than or equal to a minimum pitch from the first shape and the second shape.

At step 605, a dummy shape is designated within the intervening shape. The dummy shape is designated such that it is a minimum pitch from at least one of the first shape and the second shape. The dummy shape may also be the minimum pitch from each of the first shape and the second shape. Alternatively, more than one dummy shape may be designated within the intervening shape, such that one dummy shape is a minimum pitch from the first shape and another dummy shape is a minimum pitch from the second shape. Further, the dummy shape (or shapes) is designated to have the minimum width as the first shape and the second shape.

At step 607, a first hardmask is patterned according to the first shape, the second shape, and the dummy shape (or shapes) during a litho-etch step in forming a semiconductor layer, such as in a first or second litho-etch step in a LELE process. A second hardmask is also patterned according to the intervening shape during another litho-etch step in forming the semiconductor layer. Because the dummy shape is fully contained within the intervening shape, at least part of the patterned first hardmask and the patterned second hardmask overlap according to the second dummy shape. Accordingly, a semiconductor layer may be formed (e.g., M1 layer) that has minimum width features separated by a distance of greater than a minimum pitch without the need for retargeting.

Figure 7:
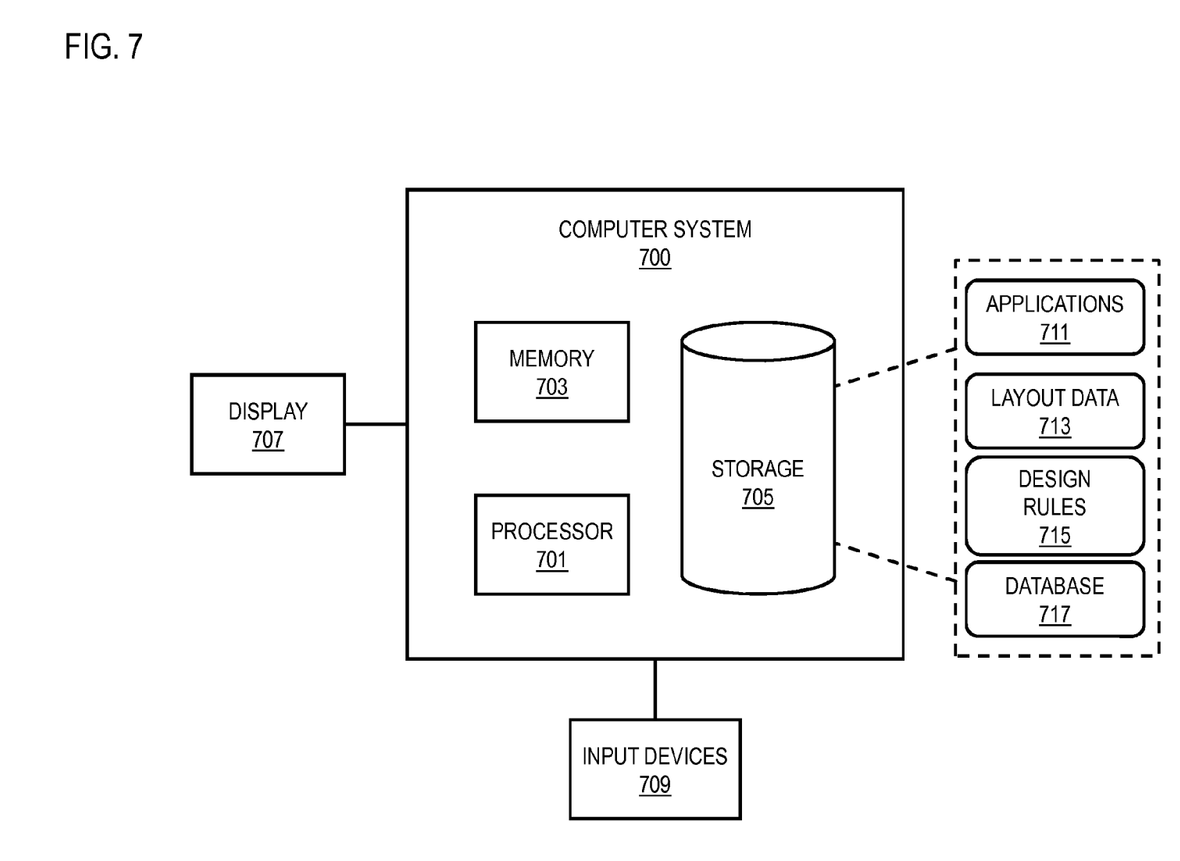
FIG. 7 schematically illustrates a computer system for implementing the process of FIG. 6, according to an exemplary embodiment.

The processes described herein may be implemented via software, hardware, firmware, or a combination thereof. Exemplary hardware (e.g., computing hardware) is schematically illustrated in FIG. 7. As shown, computer system 700 includes at least one processor 701, at least one memory 703, and at least one storage 705. Computer system 700 may be coupled to display 707 and one or more input devices 709, such as a keyboard and a pointing device. Display 707 may be utilized to provide one or more GUI interfaces. Input devices 709 may be utilized by users of computer system 700 to interact with, for instance, the GUI interfaces. Storage 705 may store applications 711, layout data (or information) 713, design plus rules 715, and at least one shape database (or repository) 717. Applications 711 may include instructions (or computer program code) that when executed by processor 701 cause computer system 700 to perform one or more processes, such as one or more of the processes described herein. In exemplary embodiments, applications 711 may include one or more manufacturability analysis and/or yield enhancement tools.

The embodiments of the present disclosure achieve several technical effects, including minimum width features, such as in an M1 layer, separated at greater than a minimum pitch while maintaining specific design constraints without the need for retargeting. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for 20 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   patterning a first hardmask according to a first shape, a second shape and a dummy shape during a first lithography-etch step in forming of a semiconductor layer, wherein:
   the first shape and the second shape have a minimum width within the semiconductor layer,
   a distance between the first shape and the second shape is greater than a minimum pitch,
   an intervening shape is provided between the first shape and the second shape,
   the dummy shape is provided within the intervening shape, and
   the dummy shape is at the minimum pitch from the first shape.

2. The method according to claim 1, further comprising:
   designating a second dummy shape within the intervening shape, wherein the second dummy shape is at the minimum pitch from the second shape.

3. The method according to claim 1, wherein the dummy shape is at the minimum pitch from the second shape.

4. The method according to claim 1, wherein:
   the dummy shape has the minimum width.

5. The method according to claim 1, further comprising:
   patterning a second hardmask according to the intervening shape during a second lithography-etch step in forming the semiconductor layer.

6. The method according to claim 5, wherein at least part of the patterned first hardmask and the patterned second hardmask overlap according to the dummy shape.

7. The method according to claim 1, wherein the semiconductor layer is a metal1 (M1) layer.

8. A method comprising:
patterning a first hardmask according to a first shape, a second shape and a dummy shape during a first lithography-etch step in forming a semiconductor layer, wherein:
the first shape has a minimum width that is greater than a minimum pitch from the second shape having the minimum width,
the dummy shape is provide in an intervening shape between the first shape and the second shape, and
the dummy shape is at the minimum pitch from the first shape and the second shape and is at least the minimum width.

9. The method according to claim 8, wherein:
the dummy shape comprises a first portion and a second portion, the first portion being at the minimum pitch from the first shape and the second portion being at the minimum pitch from the second shape.

10. The method according to claim 9, wherein:
the first portion and the second portion each have the minimum width.

11. The method according to claim 8, further comprising:
patterning a second hardmask according to the intervening shape during a second lithography-etch step in forming the semiconductor layer,
wherein at least part of the patterned first hardmask and the patterned second hardmask overlap according to the dummy shape.

* * * * *